(12) United States Patent
Ohkubo

(10) Patent No.: US 6,610,919 B2
(45) Date of Patent: Aug. 26, 2003

(54) SOLAR BATTERY

(75) Inventor: Mitsuru Ohkubo, Tokyo (JP)

(73) Assignee: Mitsubishi Denki Kabushiki Kaisha, Chiyoda-Ku (JP)

( * ) Notice: Subject to any disclaimer, the term of this patent is extended or adjusted under 35 U.S.C. 154(b) by 0 days.

(21) Appl. No.: 10/204,847

(22) PCT Filed: Dec. 27, 2001

(86) PCT No.: PCT/JP01/11582

§ 371 (c)(1),
(2), (4) Date: Aug. 26, 2002

(87) PCT Pub. No.: WO02/054501

PCT Pub. Date: Jul. 11, 2002

(65) Prior Publication Data

US 2003/0029494 A1 Feb. 13, 2003

(30) Foreign Application Priority Data

Dec. 28, 2000 (JP) ........................................ 2000-401740

(51) Int. Cl.⁷ .................... H01L 31/18; H01L 27/142
(52) U.S. Cl. .................... 136/244; 136/256; 136/293; 257/443; 257/459; 257/466
(58) Field of Search ................. 136/244, 256, 136/293; 257/443, 459, 466

(56) References Cited

U.S. PATENT DOCUMENTS 4,481,378 A * 11/1984 Lesk ........................ 136/244
6,034,322 A    3/2000 Pollard
6,353,176 B1 * 3/2002 Taylor et al. ............... 136/256
6,359,209 B1 * 3/2002 Glenn et al. ............... 136/256

FOREIGN PATENT DOCUMENTS

| EP | 0 535 614 A2 | 4/1993 |
|----|---|---|
| EP | 0 917 211 A2 | 5/1999 |
| EP | 0 984 495 A2 | 3/2000 |
| JP | 5-160425 A | 6/1993 |
| JP | 7-302923 A * | 11/1995 |
| JP | 11-150286 A | 6/1999 |
| JP | 2000-91615 A | 3/2000 |
| JP | 2001-30999 A | 2/2001 |
| WO | 00-21138 A1 | 4/2000 |

* cited by examiner

*Primary Examiner*—Alan Diamond
(74) *Attorney, Agent, or Firm*—Burns, Doane, Swecker & Mathis, LLP

(57) ABSTRACT

A diode-incorporated solar battery, which is intended to minimize an increase in production cost and a decrease in reliability that are involved in incorporating diodes into the solar battery, and to reduce the area of the surface electrodes of the solar battery so as to increase the electric power generation of the solar battery, wherein to this end, a connecting metal fixture for interconnecting solar cells has added thereto projection for parallel-connecting the solar cells and diodes.

54 Claims, 15 Drawing Sheets

SOLAR BATTERY

TECHNICAL FIELD

The present invention relates to a solar battery with built-in diodes.

BACKGROUND ART

The connection structure disclosed in U.S. Pat. No. 6,034,322 is known as a technique for mounting a diode to a solar battery cell. A top view of a conventional solar battery cell with built-in diode is shown in FIG. 9 and a cross-sectional view of the conventional solar battery cell with built-in diode is shown in FIG. 10. To effectively utilize a disc-shaped crystal substrate, a triangular planar diode is mounted at the corner crop provided in the solar battery cell.

In the figure, a solar battery cell 1 has a beveled edge where one corner has been partially removed, and a diode 2 is provided at the same position as the removed edge. In this solar battery cell with built-in diode, a diode connection bracket 3a is respectively connected to a front surface electrode 4 of the solar battery cell 1 and to a front surface electrode 6 of the diode 2, and a diode connection bracket 3b is respectively connected to a rear surface electrode 5 of the solar battery cell 1 and to a rear surface electrode 7 of the diode 2 using a method such as parallel gap welding.

This electrically connects the solar battery cell 1 and the diode 2 in parallel so that damage to the solar battery cell 1 can be prevented even if a reverse voltage is applied to the solar battery cell 1.

Furthermore, although the voltage generated from one solar battery cell differs according to the type of the solar battery cell, it has at the most a range of 0.5 to 3 V. Thus, it is common to obtain a predetermined working voltage by configuring a circuit to connect a plurality of solar battery cells in series. In an ordinary solar battery cell circuit, a plurality of solar battery cells are connected in series by connecting solar battery cell brackets to the front surfaces and the rear surfaces of adjacently positioned solar battery cells.

Therefore, in the conventional solar battery cell with built-in diode, in addition to the solar battery connection bracket for connecting each solar battery cell in series, two diode connection brackets are necessary for connecting the diode 2 in parallel.

Since the diode connection bracket, which has a characteristic shape with a function only to connect the solar battery cell and diode as described above, is used to connect the solar battery cell and the diode in the conventional solar battery cell with built-in diode, the larger number of connection points increases the time required for adding a diode to the solar battery cell, and the reliability decreases.

In particular, the front surface of the solar battery cell is provided with rectangular front surface electrodes near the periphery of the solar battery cell, and making connections, such as through welding, to match the positions of the front surface electrodes is difficult, and the assembly time increases due to the larger number of connection points.

Furthermore, simultaneously connecting the front and rear surfaces of the diode and the front and rear surfaces of the solar battery cell with connection brackets 3a, 3b was difficult. Another concern was the increase in the number of parts and part types and the increase in the cost of materials that resulted from the increase in the number of connection points.

Moreover, the solar battery array has become significantly large so that low efficiency, low cost silicon solar battery cells are not used any longer. As a result, gallium arsenide based solar battery cells of the high efficiency III-V group (of the periodic table) must be considered. Regarding these solar battery cells in terms of initial manufacturing cost, the solar battery cells forming the base are high in cost so that it is necessary to utilize the most active area of the blank cells.

In addition, another problem was that adding an electrode for connection with the diode to the front surface of the solar battery cell decreases the area contributing to power generation so that the amount of generated electricity decreases. The power loss in generated electricity accompanying the addition of electrodes is about 0.1% of the total generated electricity of one 50 mm square solar battery cell (generated electricity of about 1 W). If 100,000 of these solar battery cells are used as a solar battery for mounting in a satellite to generate electricity, a power loss of about 100 W results, which is an amount that cannot be ignored in the supply of power to the satellite.

DISCLOSURE OF INVENTION

It is therefore an object of this invention to solve the relevant problems by reducing the increase in manufacturing cost and the drop in reliability accompanying the addition of the diode to the solar battery cell, and by increasing the amount of generated electricity of the solar battery cell through the reduction of the front surface electrode area on the solar battery cell.

The solar battery relating to the present invention comprises planar first and second solar battery cells, a diode connected in parallel with the first solar battery cell, a solar battery connection bracket for connecting a front surface electrode provided on a front surface of the first solar battery cell and a rear surface electrode provided on a rear surface of the second solar battery cell and a front surface electrode provided on a front surface of the diode, and a diode connection bracket for connecting a rear surface electrode provided on a rear surface of the first solar battery cell and a rear surface electrode provided on a rear surface of the diode. The first solar battery cell and the second solar battery cell are planar solar battery cells that are substantially rectangular having four corners, at least one of the corners has a partially removed beveled edge, and the diode is positioned adjacent to the beveled edge in the area of the removed corner.

Furthermore, the solar battery connection bracket has at least one rectangular first connector for connecting the front surface electrode of the first solar battery cell and the rear surface electrode of the second solar battery cell, at least one rectangular second connector for connecting the rear surface electrode of the second solar battery cell and the front surface electrode of the diode, and at least one rectangular third connector for connecting the rear surface electrode of the first solar battery cell and the rear surface electrode of the diode. The first connector, the second connector, and the third connector may be connected on the side opposite to the light receiving surface of the solar battery cell.

Furthermore, the solar battery relating to the present invention comprises planar first and second solar battery cells, a diode connected in parallel with the first solar battery cell, a first solar battery connection bracket for connecting a front surface electrode provided on a front surface of the first solar battery cell and a rear surface electrode provided on a rear surface of the second solar battery cell, a second solar battery connection bracket for connecting the rear surface electrode of the second solar battery cell and a front surface electrode provided on the front surface of the diode, and a diode connection bracket for connecting a rear surface electrode provided on a rear surface of the first solar battery cell and a rear surface electrode provided on a rear surface of the diode. The first solar battery cell and the second solar battery cell are planar solar battery cells that are substantially rectangular having four corners, at least one of the corners has a partially removed beveled edge, and the diode is positioned adjacent to the beveled edge in the area of the removed corner.

Furthermore, the solar battery relating to the present invention is formed by positioning in successive adjacency at least two solar battery cells with built-in diode, which includes planar solar battery cells that are substantially rectangular having four corners with at least one of the corners having a partially removed beveled edge and the diode positioned adjacent to the beveled edge in the area of the removed corner, and in which front surface electrodes provided on front surfaces of the solar battery cell and the diode included in one solar battery cell with built-in diode and rear surface electrodes provided on rear surfaces of the solar battery cell and the diode included in another adjacent solar battery cell with built-in diode are connected by one solar battery connection bracket.

Furthermore, the solar battery cell relating to the present invention is formed by positioning in successive adjacency at least two solar battery cells with built-in diode, which includes planar solar battery cells that are substantially rectangular having four corners with at least one of the corners having a partially removed beveled edge and the diode positioned adjacent to the beveled edge in the area of the removed corner, and in which surface electrodes provided on front surface of the solar battery cell included in one solar battery cell with built-in diode and rear surface electrodes provided on rear surface of the solar battery cell included in another adjacent solar battery cell with built-in diode are connected by a solar battery connection bracket, and a surface electrode provided on the front surface of the diode included in the solar battery cell with built-in diode and rear surface electrodes provided on rear surfaces of the solar battery cell and the diode included in the other adjacent solar battery cell with built-in diode are connected by a diode connection bracket.

Furthermore, the solar battery connection bracket or the diode connection bracket may be made of a material that includes silver.

Furthermore, the front surface electrode or the rear surface electrode of the solar battery cell, or the front surface electrode or the rear surface electrode of the diode may include silver.

Furthermore, the solar battery connection bracket or the diode connection bracket may have a bend for a thermal expansion buffer.

Furthermore, the bends may have a U-shaped structure.

Furthermore, only one of the corners may have a beveled edge.

Furthermore, the beveled edge may be formed from an arc.

Furthermore, the solar battery cell may be cut out from a disc-shaped crystal substrate.

MODE(S) FOR CARRYING OUT THE INVENTION

The present invention will be described in detail with reference to the attached drawings.

Embodiment 1

Figure 1:
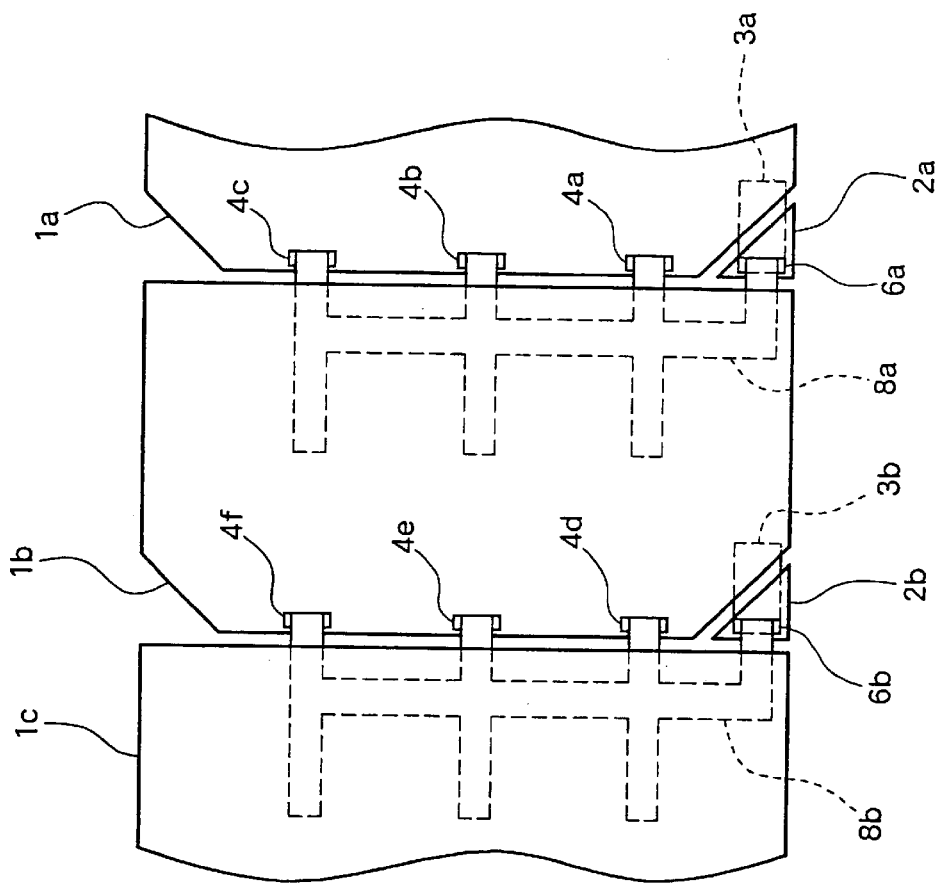
FIG. 1 is a top view of a solar battery in embodiment 1 according to the present invention.
Figure 2:
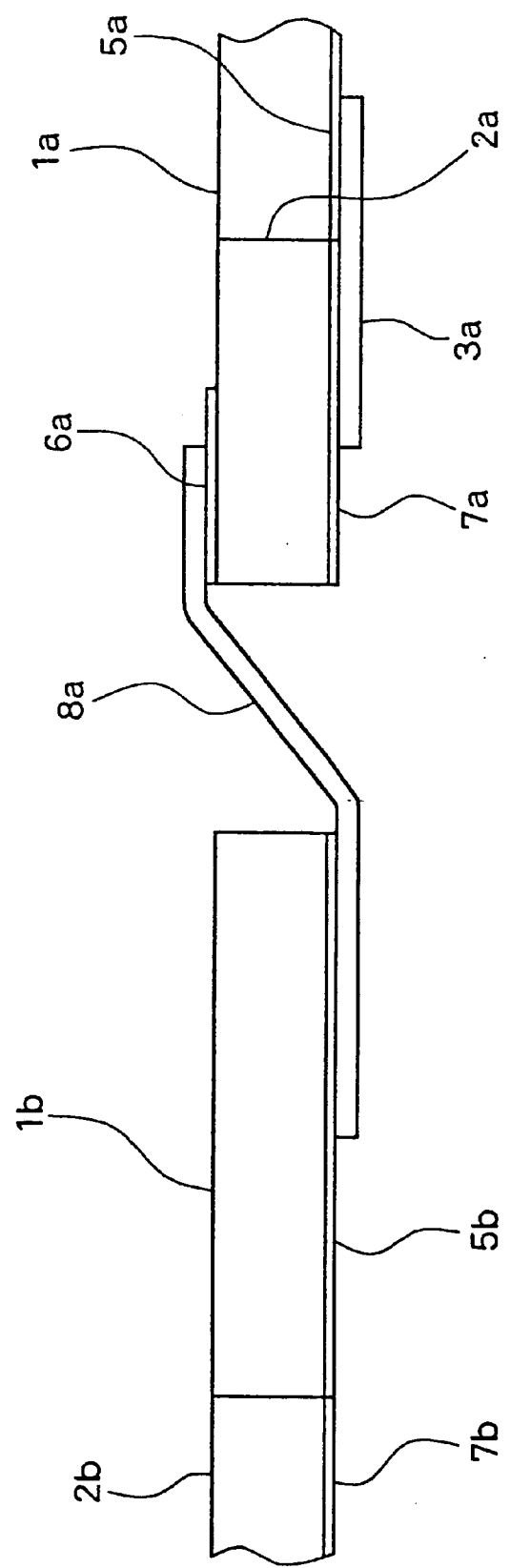
FIG. 2 is a side view of the solar battery in embodiment 1 according to the present invention.

FIG. 1 is a top view showing a part of the solar battery in embodiment 1 of the present invention. FIG. 2 is a side view of the solar battery of FIG. 1 as viewed from the bottom.

Solar battery cells 1a, 1b, 1c are disposed in the same plane. These solar battery cells 1a, 1b, 1c represent a part of a group of solar battery cells disposed in plurality. At least one corner of each solar battery cell has a partially removed beveled edge, and triangular planar diodes 2a, 2b are disposed to fit the removed beveled edges. Solar battery cells 1a, 1b respectively have front surface electrodes 4a to 4c and 4d to 4f as collector electrodes on the front surface, and rear surface electrodes 7a, 7b as collector electrodes on the rear surface. It is preferable for each of these electrode to be made of a material that includes silver and to have a thin layer of gold on the surface.

A solar battery connection bracket 8a has rectangular protrusions for connecting the front surface electrodes 4a, 4b, 4c of the solar battery cell 1a to the rear surface electrode 5b of the solar battery cell 1b, rectangular protrusions for connecting the rear surface electrode 5b of the solar battery cell 1b to a front surface electrode 6a of the diode 2a, and a comb shape formed from a connector for mutually connecting the respective protrusions. A solar battery connection bracket 8b also has a similar shape and structure and connects the front surface electrodes 4d, 4e, 4f of the solar battery cell 1b, a rear surface electrode of the solar battery cell 1c, and a surface electrode 6b of the diode 2b.

If the light receiving surface is the front surface of the solar battery cell, it is preferable to dispose the connector of the solar battery connection bracket on the rear surface of the solar battery cell to prevent shadowing of the light receiving surface. Furthermore, although the solar battery cell in the present embodiment has three front surface electrodes, this is not a limitation of the present invention provided at least one surface electrode is available, and the number of protrusions on the solar battery connection bracket may be increased or decreased according to the number of surface electrodes. It is preferable for the material of the solar battery connection brackets 8a, 8b to include silver.

Furthermore, a rear surface electrode 5a of the solar battery cell 1a and the rear surface electrode 7a of the diode 2a are connected by the diode connection bracket 3a, the adjacent solar battery cell 1a and the solar battery cell 1b are connected in series by the solar battery connection bracket 8a, and the solar battery cell 1a and the diode 2a are connected in parallel by the diode connection bracket 3a. In the same manner, the rear surface electrode 5b of the solar battery cell 1b and the rear surface electrode 7b of the diode 2b are connected by the diode connection bracket 3b, the solar battery cells 1b, 1c are connected in series by the solar battery connection bracket 8b, and the diode 2b is connected in parallel with respect to the solar battery cell 1b. It is preferable for the material of the diode connection brackets 3a, 3b to include silver.

According to the description above, it is possible to reduce the number of parts by one and the number of connections by one when compared to the case where diode connection brackets are used to respectively connect the front and rear surfaces of the diodes and the solar battery cells.

Embodiment 2

Figure 3:
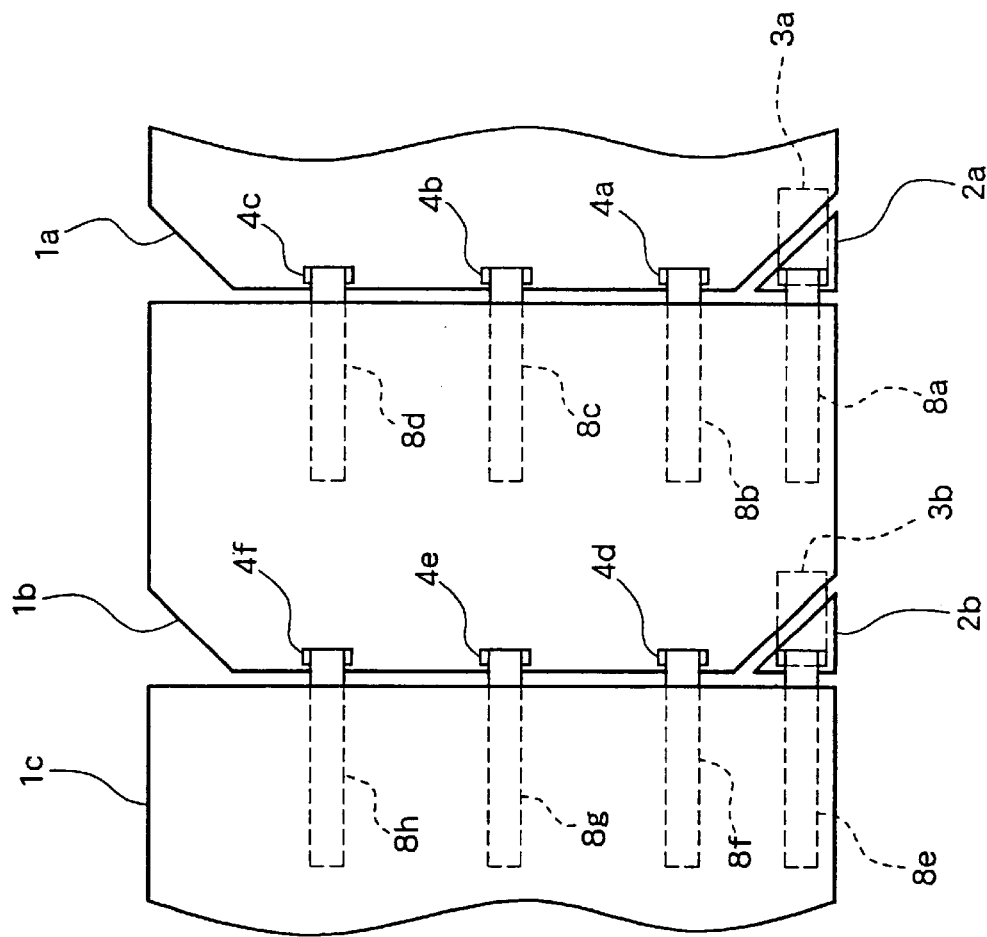
FIG. 3 is a top view of a solar battery in embodiment 2 according to the present invention.

FIG. 3 is a top view showing a part of the solar battery in embodiment 2 of the present invention.

As in embodiment 1, the solar battery cells 1a, 1b, 1c are disposed in the same plane. These solar battery cells represent a part of a group of solar battery cells disposed in plurality. The lower left corner of each solar battery cell has a partially removed beveled edge, and triangular planar diodes 2a, 2b are disposed to fit the removed parts. The solar battery cells 1a, 1b respectively have front surface electrodes 4a to 4c and 4d to 4f as collector electrodes on the front surface, and rear surface electrodes generally covering the entire rear surface as collector electrodes on the rear surface.

The front surface electrodes 4a, 4b, 4c of the solar battery cell 1a and the rear surface electrodes of the solar battery cell 1b are connected by solar battery connection brackets 8b, 8c, 8d. The rear electrode of the solar battery cell 1b is further connected to the front surface electrode of the diode 2a by the solar battery connection bracket 8a. In the same manner, the front surface electrodes 4d, 4e, 4f of the solar battery cell 1b and the rear surface electrodes of the solar battery cell 1c are connected by solar battery connection brackets 8f, 8g, 8h, and the rear surface electrode of the solar battery cell 1c is further connected to the front surface electrode of the diode 2b by a solar battery connection bracket 8e.

The rear surface electrode of the solar battery cell 1a and the rear surface electrode of the diode 2a are connected by a diode connection bracket 3a. In the same manner, the rear surface electrode of the solar battery cell 1b and the rear surface electrode of the diode 2b are connected by the diode connection bracket 3b.

Although each solar battery cell in the present embodiment has three surface electrodes, this is not a limitation of the present invention provided at least one surface electrode is available, and the number of solar battery connection brackets may be increased or decreased according to the number of surface electrodes. It is preferable for the material of the solar battery connection brackets 8a to 8h and of the diode connection brackets 3a, 3b to include silver.

In the solar battery cell with built-in diode as configured above, the adjacent solar battery cells are each connected in series and the diodes are connected in parallel with each solar battery cell.

Therefore, in comparison to embodiment 1, there is no need to use connection brackets having a complex shape (comb) by using the same-shaped connection brackets 8a to 8h to connect the surface electrodes of the solar battery cells and diodes via the rear surface electrodes of adjacent solar battery cells. Only diode connection brackets (3a, 3b) and solar battery connection brackets (8a to 8h) having the same shape (rectangular) but only different lengths are used so that the types of parts can be reduced.

According to the description above, by using connection brackets having the same shape to connect the front surface electrodes of the solar battery cells and diodes via the rear surface electrodes of adjacent solar battery cells, the types of parts can be reduced.

Embodiment 3

Figure 4:
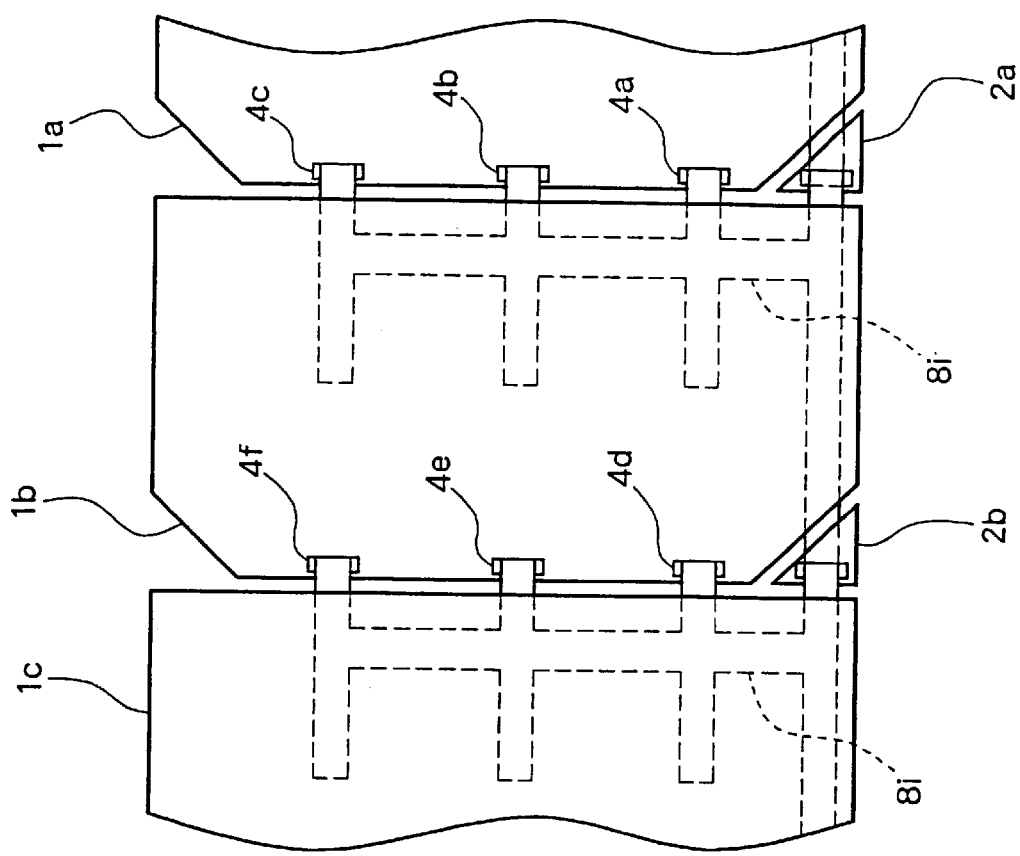
FIG. 4 is a top view of a solar battery in embodiment 3 according to the present invention.
Figure 5:
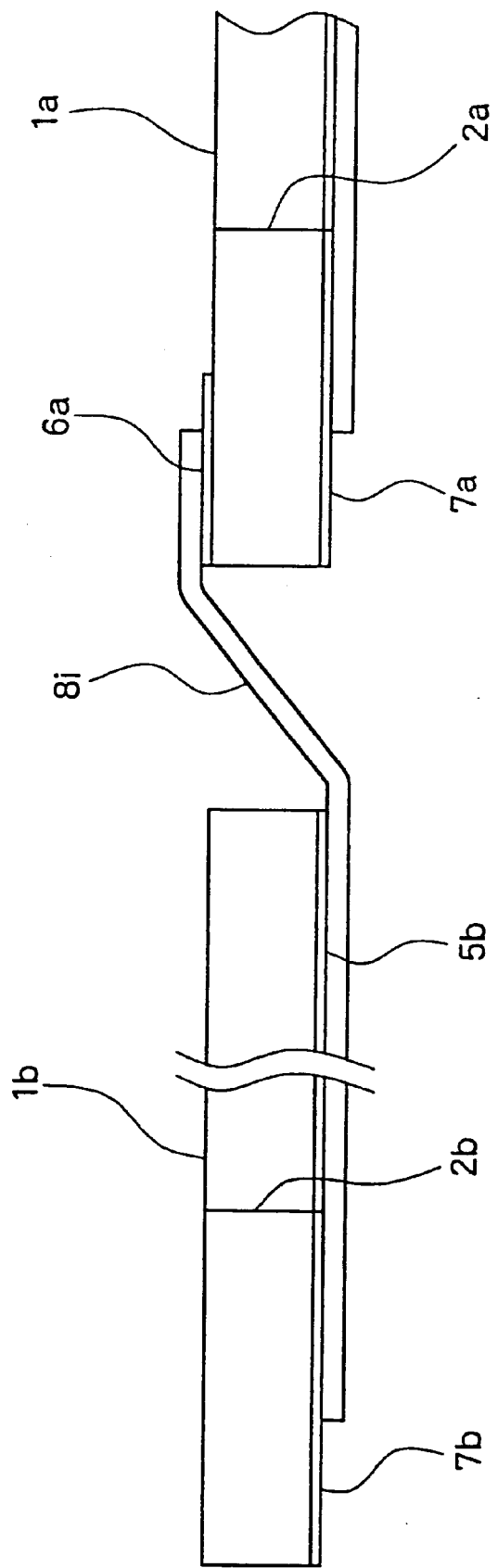
FIG. 5 is a side view of the solar battery in embodiment 3 according to the present invention.

FIG. 4 is a top view showing a part of the solar battery in embodiment 3 of the present invention. FIG. 5 is a side view of the solar battery of FIG. 4 as viewed from the bottom.

Solar battery cells 1a, 1b, 1c are disposed in the same plane. These solar battery cells 1a, 1b, 1c represent a part of a group of solar battery cells disposed in plurality. At least one corner of each solar battery cell has a partially removed beveled edge, and triangular planar diodes 2a, 2b are disposed to fit the removed beveled edges. Solar battery cells 1a, 1b have front surface electrodes 4a to 4c and 4d to 4f as collector electrodes on the front surface, and rear surface electrodes 7a, 7b as collector electrodes on the rear surface. It is preferable for each of these electrodes to be made of a material that includes silver and to have a thin layer of gold on the surface.

A solar battery connection bracket 8i has rectangular protrusions for connecting the front surface electrodes 4a, 4b, 4c of the solar battery cell 1a and the rear electrode 5b of the solar battery cell 1b, rectangular protrusions for connecting the rear surface electrode 5b of the solar battery cell 1b and the front surface electrode 6a of the diode 2a and the rear surface electrode 7b of the diode 2b, and a comb shape formed from a connector for mutually connecting the respective protrusions. A solar battery connection bracket 8j has a similar shape and structure.

Although the present embodiment has substantially the same mode as embodiment 1, the difference is that the connection bracket 8i is used instead of the individually provided solar battery connection bracket 8a and the diode connection bracket 3b in embodiment 1.

In the solar battery cell with built-in diode as configured above, the adjacent solar battery cells are each connected in series and the diodes are connected in parallel to each solar battery cell.

According to the description above, by using one solar battery connection bracket to perform both functions of connecting in series the solar battery cells and connecting in parallel the solar battery cells and diodes, the number of parts further decreases from embodiment 1 by one and the manufacturing process can be simplified.

Embodiment 4

Figure 6:
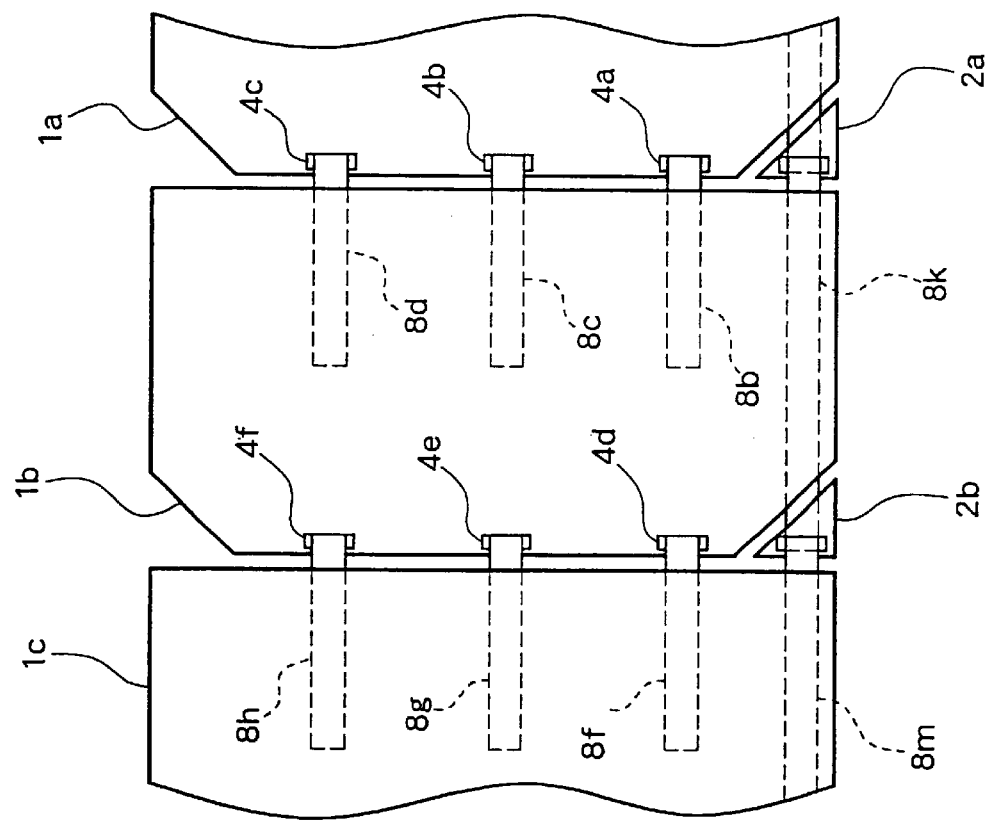
FIG. 6 is a top view of a solar battery in embodiment 4 according to the present invention.
Figure 7:
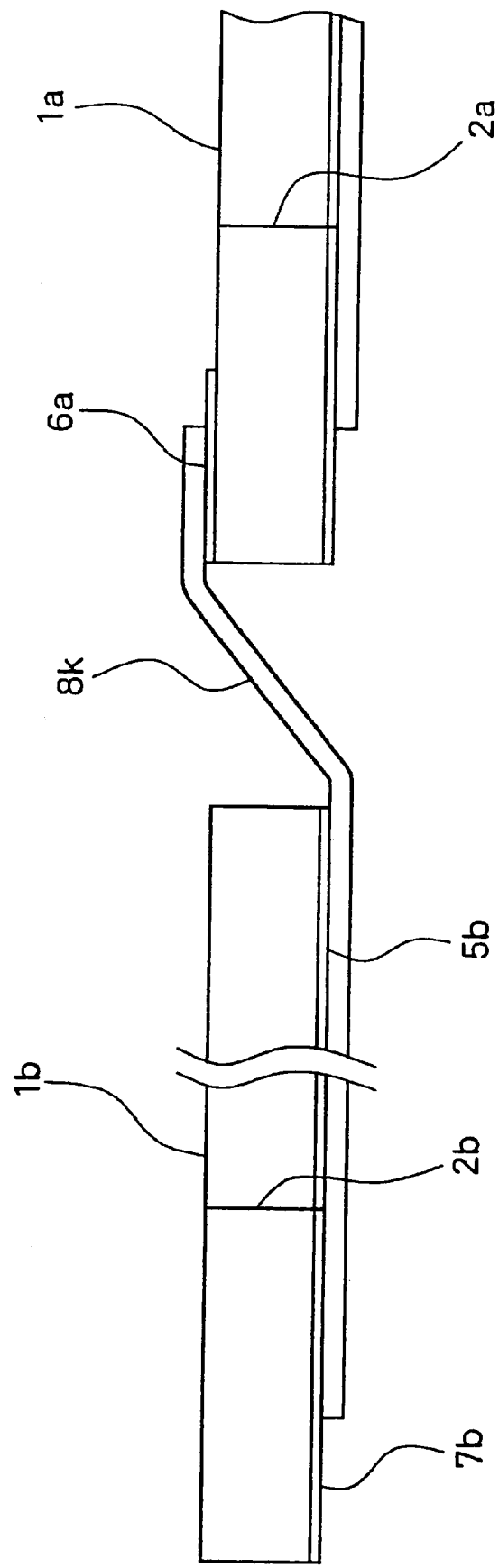
FIG. 7 is a side view of the solar battery in embodiment 4 according to the present invention.

FIG. 6 is a top view showing part of the solar battery in embodiment 4 of the present invention. FIG. 7 is a side view of the solar battery of FIG. 6 as viewed from the bottom.

Solar battery cells 1a, 1b, 1c are disposed in the same plane. These solar battery cells represent a part of a group of solar battery cells disposed in plurality. The lower left corner of each solar battery cell has a partially removed beveled edge, and the triangular planar diodes 2a, 2b are disposed to fit the removed parts. Solar battery cells 1a, 1b have front surface electrodes 4a to 4c and 4d to 4f as collector electrodes on the front surface, and rear surface electrodes generally covering the entire rear surface as collector electrodes on the rear surface.

The front surface electrodes 4a, 4b, 4c of the solar battery cell 1a and the rear surface electrode 5b of the solar battery cell 1b are connected by solar battery connection brackets 8b, 8c, 8d. The rear surface electrode 5b of the solar battery cell 1b and the front surface electrode 6a of the diode 2a and the rear surface electrode 7b of the diode 2b are connected by a solar battery connection bracket 8k. A solar battery connection bracket 8m has a similar structure.

Although the present embodiment has substantially the same mode as embodiment 2, the difference is that one solar battery connection bracket 8k is used instead of the individually provided solar battery connection bracket 8a and the diode connection bracket 3b in embodiment 2.

In the solar battery cell with built-in diode as configured above, the adjacent solar battery cells are each connected in series and the diodes are connected in parallel to each solar battery cell.

According to the description above, the number of parts compared to embodiment 2 can be further decreased by one.

Embodiment 5

Figure 8:
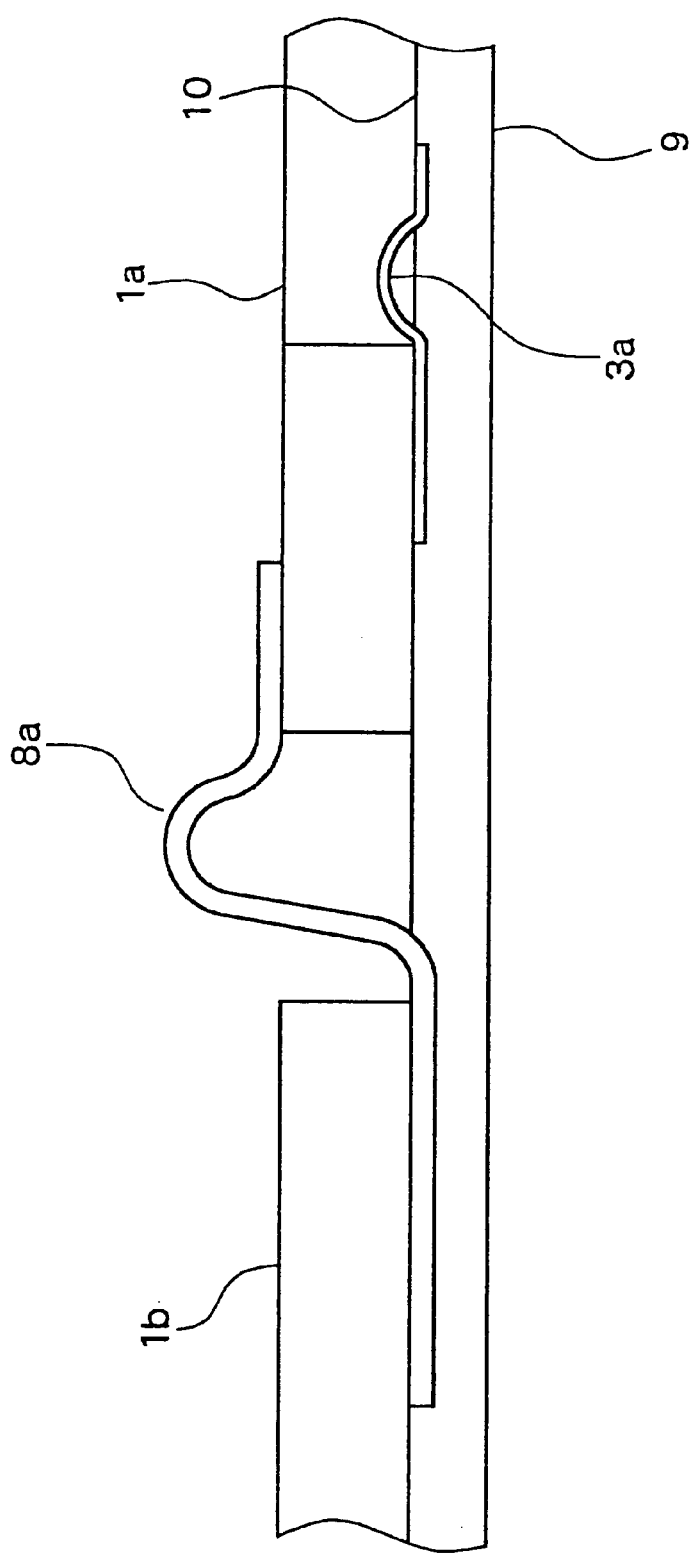
FIG. 8 is a cross-sectional view of a solar battery in embodiment 5 according to the present invention.
Figure 9:
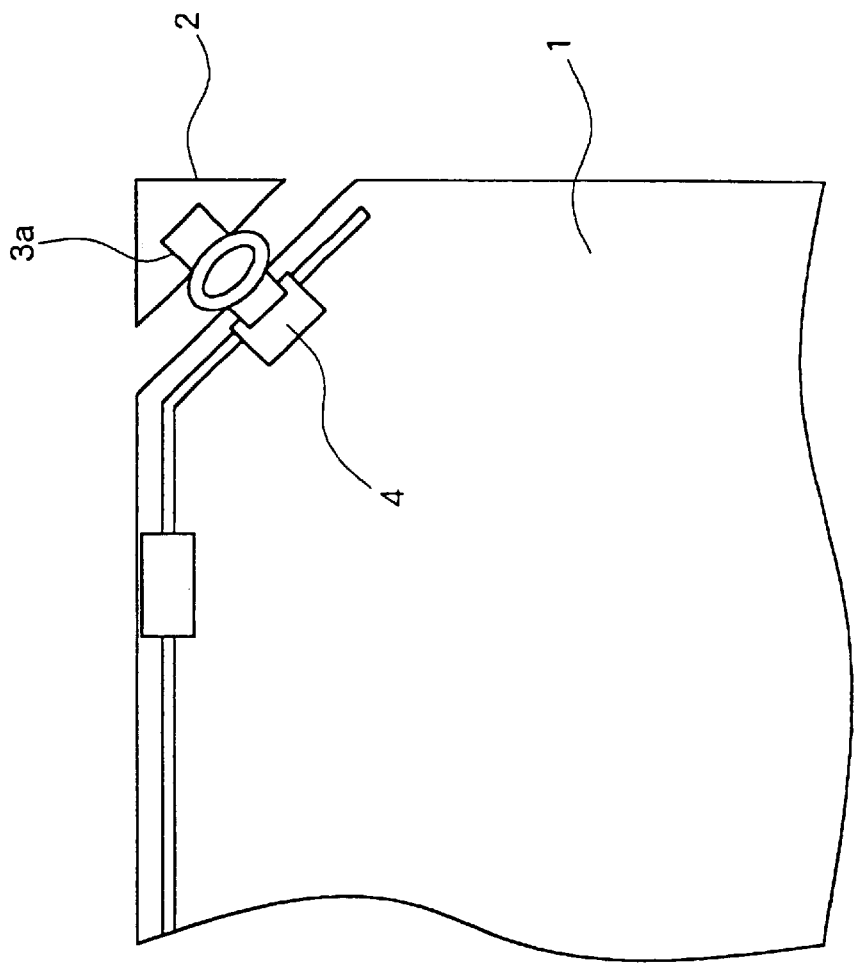
FIG. 9 is a top view of a conventional solar battery cell with built-in diode.
Figure 10:
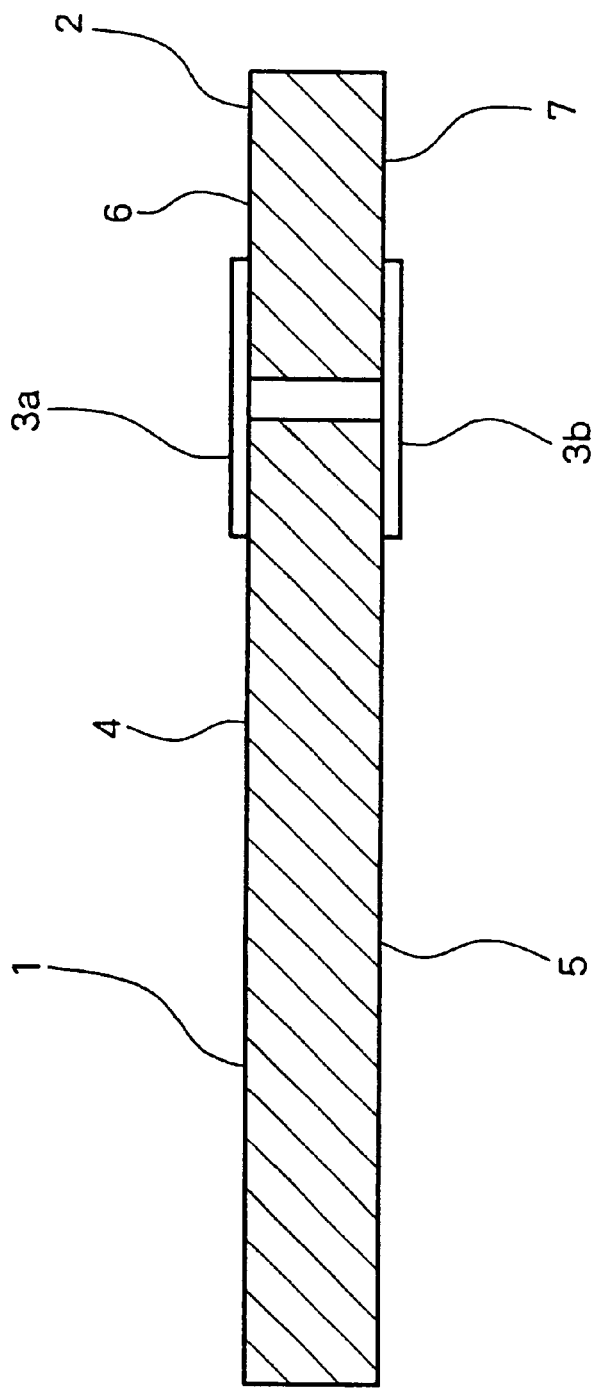
FIG. 10 is a cross-sectional view of the conventional solar battery cell with built-in diode.

FIG. 8 is a cross-sectional view of the solar battery in embodiment 5.

Although the present embodiment has substantially the same mode as embodiment 1, a support substrate 9 is further fixed with adhesive 10 to support the solar battery cells 1a, 1b. For reasons of lightness and durability, the material of the support substrate 9 should preferably be a plastic that is reinforced with carbon fibers or aramid fibers. Furthermore, for reasons of its adhesive properties, adhesion, and thermal conduction, the adhesive 10 should preferably be a silicon-based adhesive.

Furthermore, the solar battery connection bracket 8a and the diode connection bracket 3a of the present embodiment differ from those in embodiment 1 in terms of their U-shaped bends.

For example, in the case where the operating temperature range of the solar battery cell circuit is wide, such as when mounted in a satellite, the connection points at the solar battery cell 1a and the solar battery cell 1b of the solar battery connection bracket 8a, and the connection points at the solar battery cell 1a and the diode 2a of the diode connection bracket 3a are subjected to thermal loading due to the difference in the linear expansion coefficients between the solar battery connection bracket 8a and diode connection bracket 3a having base metals of silver and the support substrate 9 of plastic reinforced with carbon fibers or aramid fibers.

However, in the present embodiment, the above-mentioned thermal loading is lowered by providing U-shaped bends as shown in FIG. 8 to the solar battery connection bracket 8a and the diode connection bracket 3a and reducing the rigidity of the solar battery connection bracket 8a and the diode connection bracket 3a.

Clearly in the above-mentioned description, it is preferable for the bends in the solar battery connection bracket 8a and the diode connection bracket 3a to have the U shape as in the present embodiment for the reason of ease of machining. However, the present invention is not limited to this. Any method for reducing the rigidity of the solar battery connection bracket 8a and the diode connection bracket 3a so as to lower the thermal loading on the connection points due to thermal expansion is sufficient. For example, a bellows shape, a W (or M) shape, or a Z shape is sufficient.

Furthermore, the bends in the present embodiment can also be applied to the solar battery connection brackets and the diode connection brackets in the other embodiments.

According to the description above, when the solar battery cell circuit is used in a wide temperature range, the thermal loading on the connection points on the solar battery cells and the diodes can be lowered so as to improve the reliability of the connections.

Embodiment 6

Although there are various manufacturing methods for solar battery cells, common manufacturing methods include diffusing impurities in a disc-shaped crystal substrate (wafer) 12 that is cut out from a cylindrical silicon or compound semiconductor crystal material and forming a PN junction surface, or forming a semiconductor layer on a crystal substrate and then forming a PN junction surface.

Figure 11:
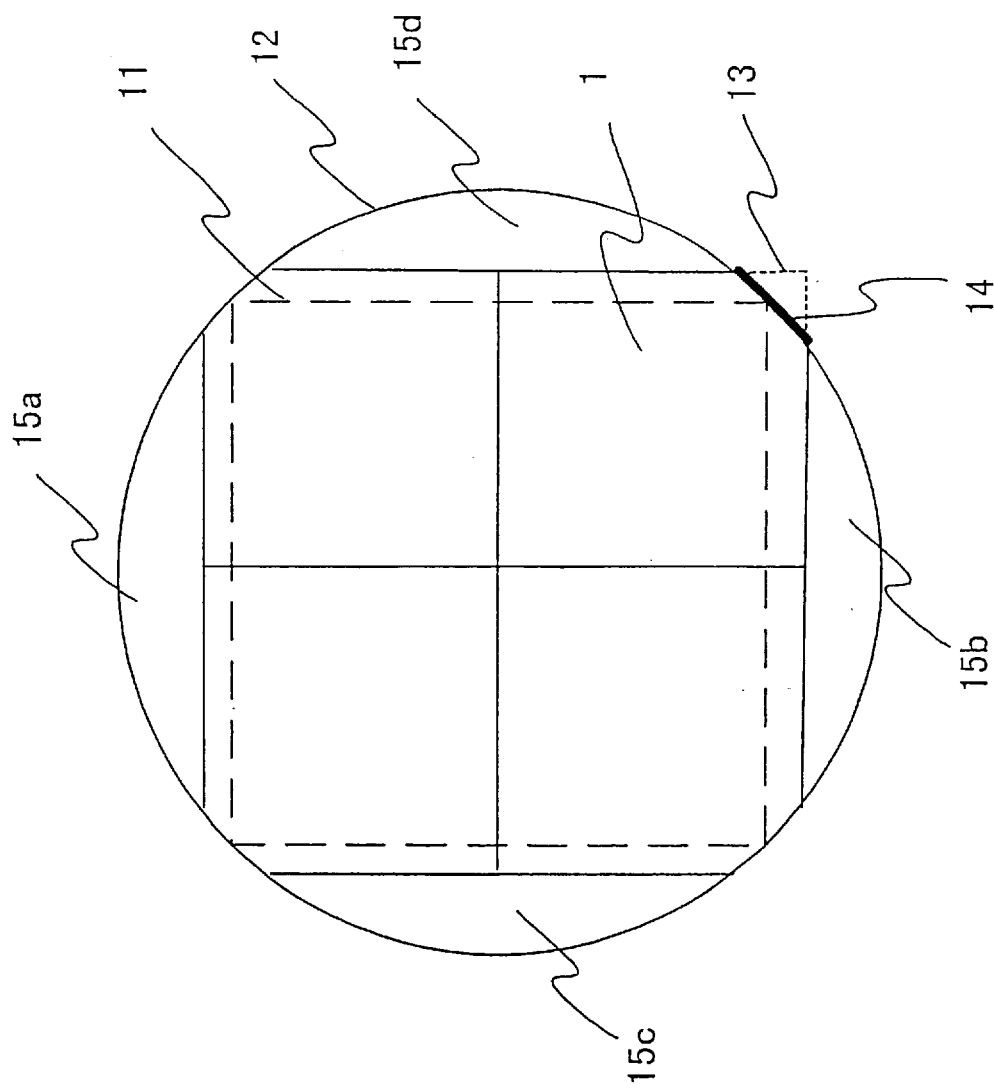
FIG. 11 shows the shape of a solar battery in embodiment 6 according to the present invention.

FIG. 11 shows the shapes of the crystal substrate 12 and the solar battery cell 1 when manufacturing rectangular planar solar battery cells from the disc-shaped crystal substrate 12 in embodiment 6 of the present invention.

When cutting out the rectangular planar solar battery cell 1 from the disc-shaped crystal substrate 12 in the present embodiment, a square that is larger than the square having its diagonal the same length as the diameter of the disc-shaped crystal substrate 12 is cut out. Furthermore, four solar battery cells are divided from the center lines of each side of the solar battery cell 1. This technique enables four solar battery cells, each having a notch 13 to form one corner with a partially removed beveled edge 14, to be taken from one disc-shaped crystal substrate 12.

As an example, when the disc-shaped crystal substrate 12 has a diameter of 100 mm, the maximum size of a square 11 in the 100 mm diameter circle is 70 mm×70 mm if the edge clearance requirement is ignored. This square provides four 35 mm×35 mm cells, respectively delimiting solar battery cell areas of 1225 mm$^2$.

In comparison to this, for example, if the solar battery cell 1 in the form of a square (84.8 mm×84.8 mm) having a diagonal of 120 mm is cut out and divided into four solar battery cells, a solar battery cell area of 1690.5 mm$^2$ each having the beveled edge 14 in one corner can be obtained.

The most common substrate in the manufacture of solar battery cells for space vehicles using both silicon and gallium arsenide is a round semiconductor material having a diameter of 100 mm. Although other diameter sizes, such as 75 mm, 125 mm, and 150 mm, can be cited, the technique described herein is applicable in a similar manner.

Figure 12:
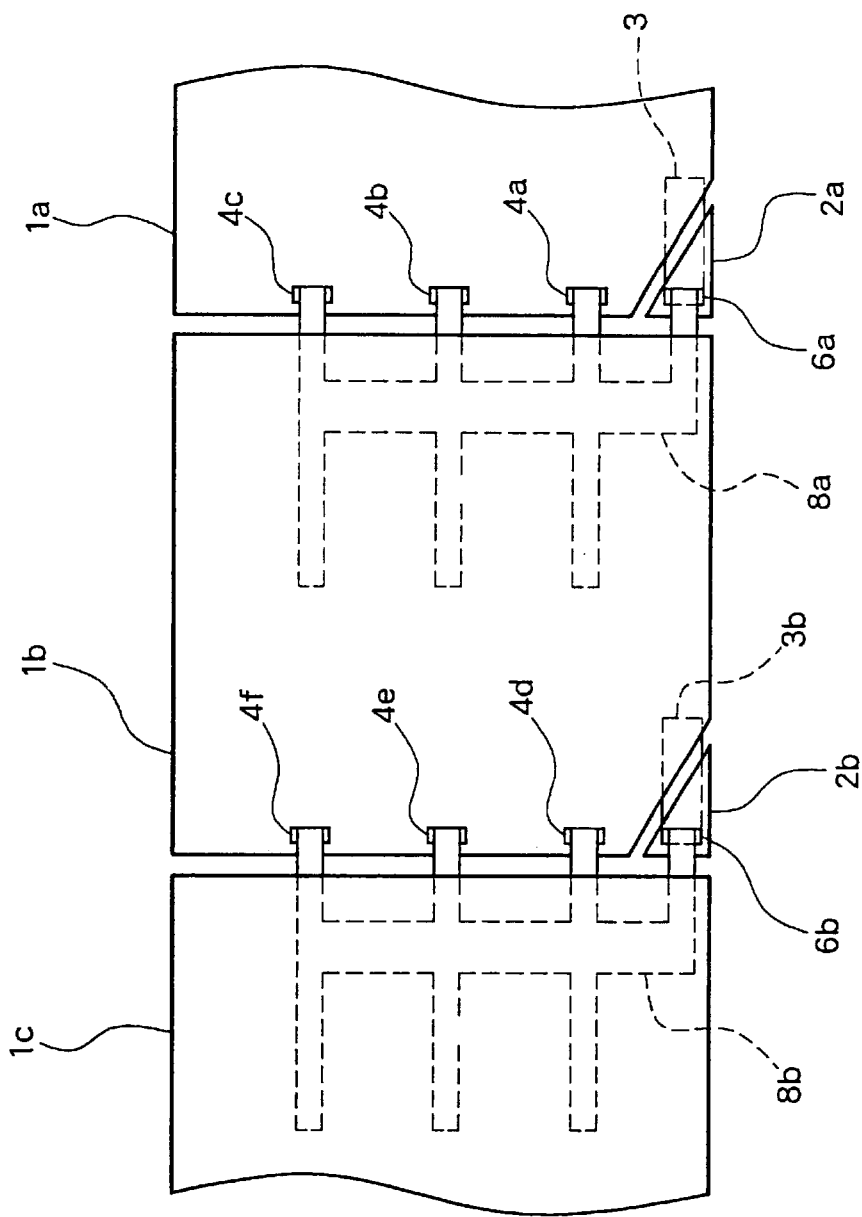
FIG. 12 is an assembly diagram of the solar battery in embodiment 6 according to the present invention.

FIG. 12 is an assembly diagram of a solar battery in which are disposed the solar battery cells 1a, 1b, 1c obtained from the technique of the present embodiment.

If diodes 2a, 2b are disposed in the triangular notches 13 of the beveled edges 14 in the solar battery cells 1a, 1b, 1c manufactured according to the above-mentioned technique, each solar battery cell and diode can be disposed in the same plane without gaps.

The solar battery connection bracket 8a has rectangular protrusions for connecting the front surface electrodes 4a, 4b, 4c of the solar battery cell 1a and the rear surface electrodes of the solar battery cell 1b, rectangular protrusions for connecting the rear surface electrode of the solar battery cell 1b and the front surface electrode 6a of the diode 2a, and a comb shape formed from a connector for mutually connecting the respective protrusions. The solar battery connection bracket 8b has a similar shape and structure and connects the front surface electrodes 4d, 4e, 4f of the solar battery cell 1b, the rear surface electrode of the solar battery cell 1c, and the front surface electrode 6b of the diode 2b.

Furthermore, the rear surface electrode of the solar battery cell 1a and the rear surface electrode of the diode 2a are connected by the diode connection bracket 3a, the adjacent solar battery cell 1a and the solar battery cell 1b are connected in series by the solar battery connection bracket 8a, and the solar battery cells 1a, 1b and the diode 2a are connected in parallel by the diode connection bracket 3a. In the same manner, the rear surface electrode of the solar battery cell 1b and the rear surface electrode of the diode 2b are connected by the diode connection bracket 3b, and the solar battery connection bracket 8b connects the solar battery cells 1b, 1c in series, to which the diode 2b is connected in parallel.

Although applied to embodiment 1 in the description above, the solar battery cells obtained from the technique of the present embodiment can also be used to form the solar battery cells with built-in diodes in embodiments 2 to 5.

Using the solar battery cells of the present embodiment, the area of edge portions 15a to 15d (shown in FIG. 11) after cutting out the solar battery cells from the disc-shaped crystal substrate 12 can be minimized. Furthermore, combining diodes with the notches 13 in the cut out solar battery cells can prevent wasted area from being created within the solar battery cell module.

Embodiment 7

Figure 13:
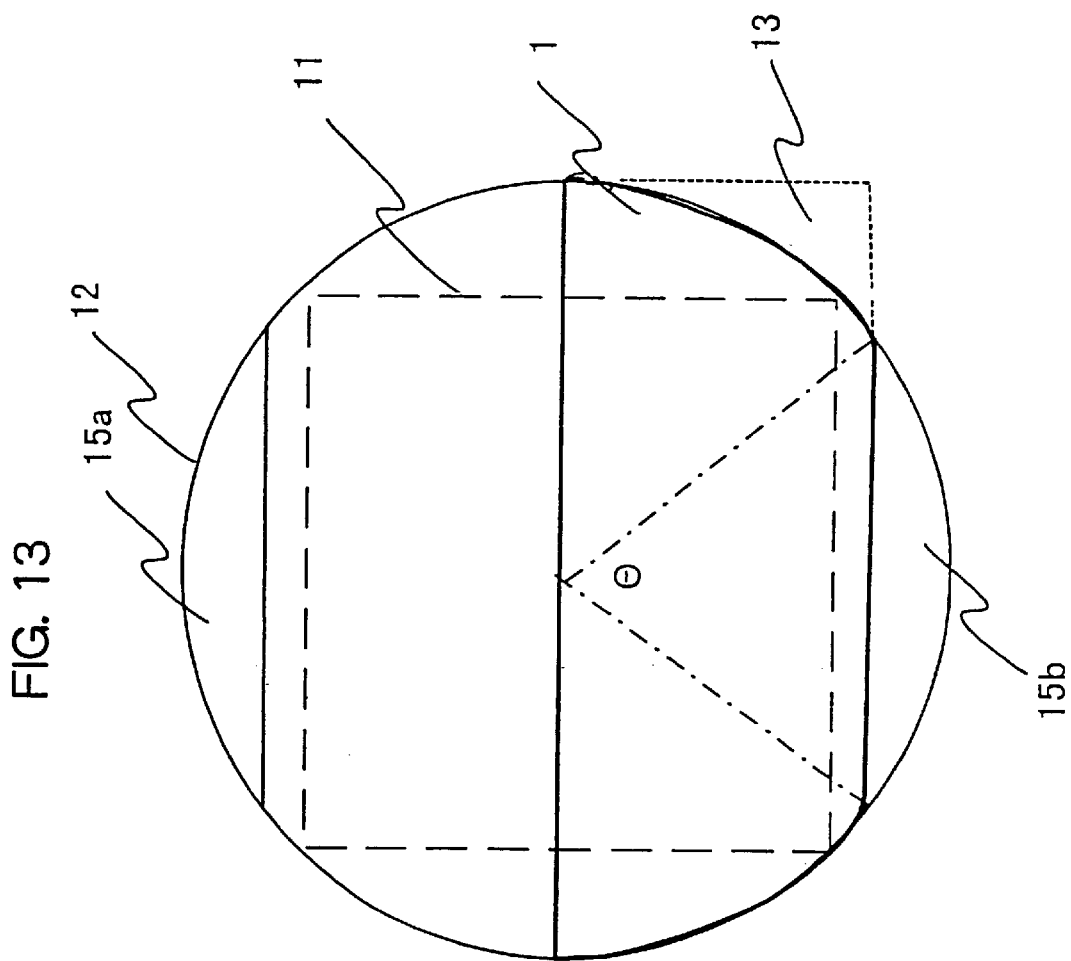
FIG. 13 shows the shape of a solar battery in embodiment 7 according to the present invention.

FIG. 13 shows the shape of the disc-shaped crystal substrate 12 and the solar battery cell 1 when manufacturing the solar battery cell from the disc-shaped crystal substrate 12 in embodiment 7 of the present invention.

In the solar battery cell 1 of the present embodiment, leaving the circular portions of the disc-shaped crystal substrate 12 with respect to the solar battery cells of embodiment 6 increases the portions that are usable as solar battery cells when manufacturing from the initial crystal substrate material.

In FIG. 13 are shown two solar battery cells 1 cut out from one disc-shaped crystal substrate 12 leaving circular portions at two short edges. Edges portions 15a, 15b are cut at an angle of Θ from the center of the circle from the solar battery cell 1. The angle Θ is usually 60° or 90° but may also be 0° in some cases.

In the present embodiment, the portions corresponding to the edge areas 15c, 15d (shown in FIG. 11) of the disc-shaped crystal substrate 12 in embodiment 6 disappear.

As an example, when the disc-shaped crystal substrate 12 has a diameter of 100 mm, the maximum size of the square 11 in the 100 mm diameter circle is 70 mm×70 mm if the edge clearance requirement is ignored. Therefore, the solar battery cell 1 having a circular portion with diameter of 50 mm and a cutting angle Θ delimits respective solar battery cell areas of 3699 mm² when Θ=60°.

According to the description above, the usable area for solar battery cells from the 100 mm diameter wafer is substantially improved from the 4900 mm² area of the square solar battery cell of 70 mm×70 mm to 7389 mm$_2$, and the initial manufacturing cost can be substantially reduced.

Figure 14:
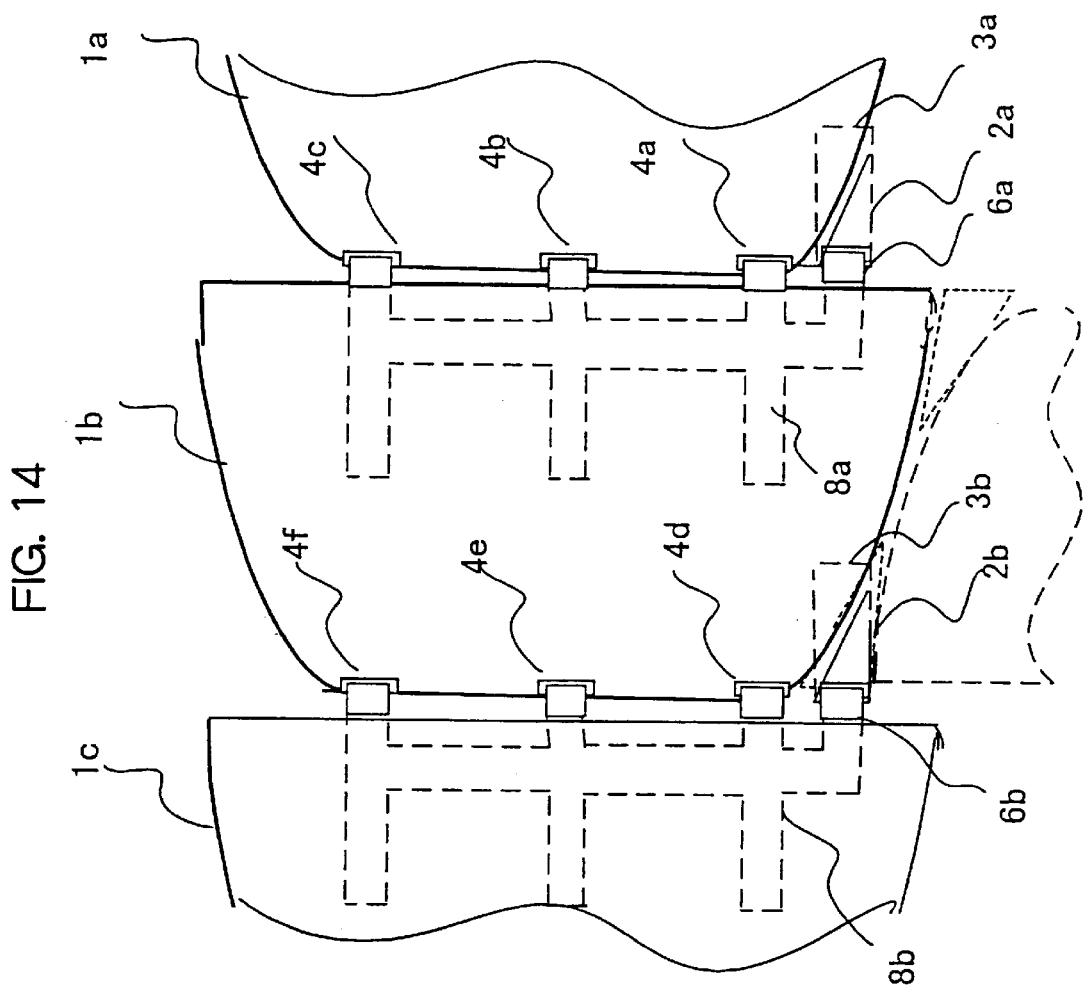
FIG. 14 is an assembly diagram of the solar battery in the embodiment 7 according to the present invention.

FIG. 14 shows an example of an assembly diagram in which solar battery cells having circular portions are effectively disposed in the solar battery in the present embodiment.

The solar battery cells 1a, 1b, 1c having circular portions are disposed in the same plane with the linear long edge and the short edge opposing each other. Below this row of solar battery cells is disposed in a mutually fitting manner a row of solar battery cells with the circular portions facing the opposite horizontal direction (indicated by dotted lines) so as to fill the space 13 of FIG. 13. The diodes 2a, 2b are disposed so as to fill the clearance between the rows of solar battery cells.

The solar battery connection bracket 8a has rectangular protrusions for connecting the front surface electrodes 4a, 4b, 4c of the solar battery cell 1a and the rear surface electrodes of the solar battery cell 1b, rectangular protrusions for connecting the rear surface electrode of the solar battery cell 1b and the front surface electrode 6a of the diode 2a, and a comb shape formed from a connector for mutually connecting the respective protrusions. The solar battery connection bracket 8b also has a similar shape and structure and connects the front surface electrodes 4d, 4e, 4f of the solar battery cell 1b, the rear surface electrode of the solar battery cell 1c, and the front surface electrode 6b of the diode 2b.

Furthermore, the rear surface electrode of the solar battery cell 1a and the rear surface electrode of the diode 2a are connected by the diode connection bracket 3a, the adjacent solar battery cell 1a and the solar battery cell 1b are connected in series by the solar battery connection bracket 8a, and the solar battery cell 1a and the diode 2a are connected in parallel by the diode connection bracket 3a. In the same manner, the rear surface electrode of the solar battery cell 1b and the rear surface electrode of the diode 2b are connected by the diode connection bracket 3b, the solar battery cells 1b, 1c are connected in series by the solar battery connection bracket 8b, and the diode 2b is connected in parallel with respect to the solar battery cell 1b.

Although each solar battery cell and diode are connected in the present embodiment according to a mode similar to that of embodiment 1, embodiments 2 to 5 may also be applied.

As in the present embodiment, configuring a solar battery module by disposing the solar battery cells with circular portions enables the unused spaces of the solar battery module to be minimized. Furthermore, disposing the planar diodes further effectively utilizes the unused spaces.

Furthermore, the solar battery cell can improve efficiency in terms of initial manufacturing cost by eliminating the waste in the disc-shaped crystal substrate 12, reducing the number of machining processes for cutting from the disc-shaped crystal substrate 12, and increasing the light receiving area on the solar battery cell module.

Figure 15:
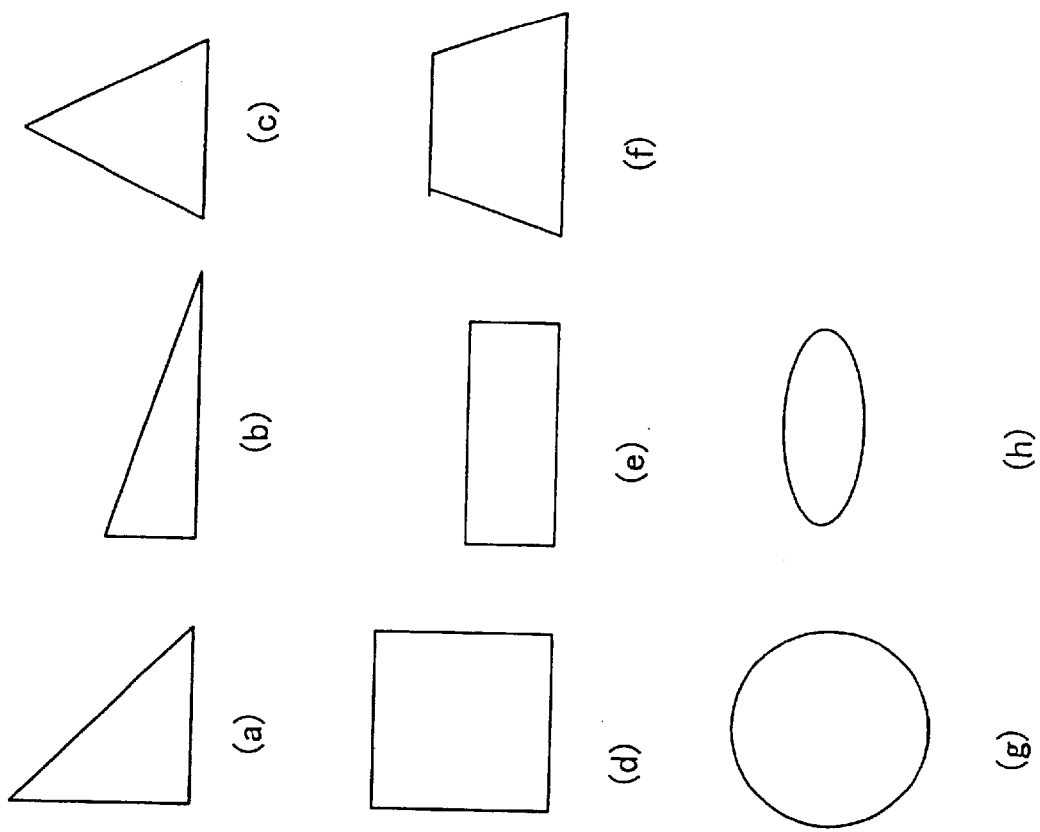
FIG. 15 shows the shape of the diode used in the present invention.

Finally, the shapes of the diodes used in common with all of the above embodiments will be described. FIG. 15 shows the shapes of the diodes used in the present invention. FIGS. 15(a) to (c) represent triangular diodes, (d) to (f) represent quadrangular diodes, and (g) and (h) represent circular diodes. The thickness of each diode is substantially the same as the thickness of the solar battery cell.

Although the isosceles right triangle of FIG. 15(a) is a preferable shape for the diode to be used in embodiments 1 to 7, there are instances where the diode of FIG. 15(b) can minimize wasted space according to the shape of the disposed space of the diode when the shape of the solar battery cell is changed.

Furthermore, when recognizing the wasted space near the diode as in embodiments 6 and 7, the diode shape is selected on the basis of, besides space utilization efficiency, the shape of the diode arrangement space according to the arrangement method of the solar battery cells and such factors as the diode manufacturing cost, for example, and there are instances where it is preferable to use the shapes of FIGS. 15(c) to (f).

INDUSTRIAL APPLICABILITY

As described above, the solar battery relating to the present invention can reduce waste in the number of machining processes in the initial manufacturing cost for cutting out the solar battery cells from the disc-shaped crystal substrate, cut the number of assembly processes, and further increase the light receiving surface on the solar battery cells.

What is claimed is:

1. A solar battery comprising:
   planar first and second solar battery cells;
   a diode connected in parallel with said first solar battery cell;
   a solar battery connection bracket for connecting a front surface electrode provided on a front surface of said first solar battery cell and a rear surface electrode provided on a rear surface of said second solar battery cell and a front surface electrode provided on a front surface of said diode; and
   a diode connection bracket for connecting a rear surface electrode provided on a rear surface of said first solar battery cell and a rear surface electrode provided on a rear surface of said diode;
   said first solar battery cell and said second solar battery cell are planar solar battery cells that are substantially rectangular having four corners, at least one of said corners has a partially removed beveled edge, and said diode is disposed adjacent to the beveled edge in the area of the removed corner.

2. A solar battery according to claim 1, wherein said solar battery connection bracket comprises:
   at least one rectangular first connector for connecting said front surface electrode of said first solar battery cell and said rear surface electrode of said second solar battery cell; and
   at least one rectangular second connector for connecting said rear surface electrode of said second solar battery cell and said front surface electrode of said diode; and
   wherein said diode connection bracket further comprises at least one rectangular third connector for connecting said rear surface electrode of said first solar battery cell and said rear surface electrode of said diode; and
   said first connector and said second connector and said third connector are connected on a side opposite to a light receiving surface of said first and second solar battery cells.

3. A solar battery comprising:
   planar first and second solar battery cells;
   a diode connected in parallel with said first solar battery cell;
   a first solar battery connection bracket for connecting a front surface electrode provided on a front surface of said first solar battery cell and a rear surface electrode provided on a rear surface of said second solar battery cell;
   a second solar battery connection bracket for connecting said rear surface electrode of said second solar battery cell and a front surface electrode provided on a front surface of said diode; and
   a diode connection bracket for connecting a rear surface electrode provided on a rear surface of said first solar battery cell and a rear surface electrode provided on a rear surface of said diode;
   said first solar battery cell and said second solar battery cell are planar solar battery cells that are substantially rectangular having four corners, at least one of said corners has a partially removed beveled edge, and said diode is disposed adjacent to the beveled edge in the area of the removed corner.

4. A solar battery, in which at least two solar battery cells with built-in diodes are adjacently disposed in succession comprising:
   a substantially rectangular and planar solar battery cell having four corners and a beveled edge formed by partially removing at least one of the corners; and
   a diode disposed adjacent to the beveled edge in the area of the removed corner; and in which
   front surface electrodes provided on front surfaces of a solar battery cell and a diode included in one solar battery cell with built-in diode and rear surface electrodes provided on rear surfaces of a solar battery cell and a diode included in another solar battery cell with built-in diode adjacent to said one solar battery cell with built-in diode are connected by one solar battery connection bracket.

5. A solar battery, in which at least two solar battery cells with built-in diodes are adjacently disposed in succession comprising:
   a substantially rectangular and planar solar battery cell having four corners and a beveled edge formed by partially removing at least one of the corners; and
   a diode disposed adjacent to the beveled edge in the area of the removed corner; and in which
   front surface electrodes provided on a front surface of a solar battery cell included in a solar battery cell with built-in diode and rear surface electrodes provided on a rear surface of a solar battery cell included in another solar battery cell with built-in diode adjacent to said solar battery cell with built-in diode are connected by a solar battery connection bracket; and
   a front surface electrode provided on a front surface of the diode included in said solar battery cell with built-in diode and one rear surface electrode provided on the rear surface of the solar battery cell and a rear surface electrode provided on a rear surface of the diode included in said another solar battery cell with built-in diode adjacent to said solar battery cell with built-in diode are connected by a diode connection bracket.

6. A solar battery as in claim 1, wherein said solar battery connection bracket or said diode connection bracket is made of a material that includes silver.

7. A solar battery as in claim 1, wherein said front surface electrode of said first solar battery cell or said rear surface electrode of said first and second solar battery cells, or said front surface electrode or said rear surface electrode of said diode includes silver.

8. A solar battery as in claim 1, wherein said solar battery connection bracket or said diode connection bracket has a bend as a thermal expansion buffer.

9. A solar battery according to claim 8, wherein said bend has a U-shaped structure.

10. A solar battery as in claim 1, wherein only one of said corners has a beveled edge.

11. A solar battery as in claim 1, wherein said beveled edge is formed from an arc.

12. A solar battery as in claim 1, wherein said first and second solar battery cells are cut out from a disc-shaped crystal substrate.

13. A solar battery as in claim 2, wherein said solar battery connection bracket or said diode connection bracket is made of a material that includes silver.

14. A solar battery as in claim 3, wherein said first and second solar battery connection brackets or said diode connection bracket is made of a material that includes silver.

15. A solar battery as in claim 4, wherein said one solar battery connection bracket is made of a material that includes silver.

16. A solar battery as in claim 5, wherein said solar battery connection bracket or said diode connection bracket is made of a material that includes silver.

17. A solar battery as in claim 2, wherein said front surface electrode of said first solar battery cell or said rear surface electrode of said first and second solar battery cells, or said front surface electrode or said rear surface electrode of said diode includes silver.

18. A solar battery as in claim 3, wherein said front surface electrode of said first solar battery cell or said rear surface electrode of said first and second solar battery cells, or said front surface electrode or said rear surface electrode of said diode includes silver.

19. A solar battery as in claim 4, wherein said front surface electrodes of said solar battery cell and said diode included in said one solar battery cell with built-in diode, or said rear surface electrodes of said solar battery cell and said diode included in said another solar battery cell with built-in diode includes silver.

20. A solar battery as in claim 5, wherein said front surface electrodes of said solar battery cell and said diode of said solar battery cell with built-in diode, or said rear surface electrodes of said solar battery cell and said diode of said another solar battery cell with built-in diode includes silver.

21. A solar battery as in claim 6, wherein said front surface electrode of said first solar battery cell or said rear surface electrode of said first and second solar battery cells, or said front surface electrode or said rear surface electrode of said diode includes silver.

22. A solar battery as in claim 2, wherein said solar battery connection bracket or said diode connection bracket has a bend as a thermal expansion buffer.

23. A solar battery as in claim 3, wherein said first and second solar battery connection brackets or said diode connection bracket has a bend as a thermal expansion buffer.

24. A solar battery as in claim 4, wherein said one solar battery connection bracket has a bend as a thermal expansion buffer.

25. A solar battery as in claim 5, wherein said solar battery connection bracket or said diode connection bracket has a bend as a thermal expansion buffer.

26. A solar battery as in claim 6, wherein said solar battery connection bracket or said diode connection bracket has a bend as a thermal expansion buffer.

27. A solar battery as in claim 7, wherein said solar battery connection bracket or said diode connection bracket has a bend as a thermal expansion buffer.

28. A solar battery as in claim 2, wherein only one of said corners has a beveled edge.

29. A solar battery as in claim 3, wherein only one of said corners has a beveled edge.

30. A solar battery as in claim 4, wherein only one of said corners has a beveled edge.

31. A solar battery as in claim 5, wherein only one of said corners has a beveled edge.

32. A solar battery as in claim 6, wherein only one of said corners has a beveled edge.

33. A solar battery as in claim 7, wherein only one of said corners has a beveled edge.

34. A solar battery as in claim 8, wherein only one of said corners has a beveled edge.

35. A solar battery as in claim 9, wherein only one of said corners has a beveled edge.

36. A solar battery as in claim 2, wherein said beveled edge is formed from an arc.

37. A solar battery as in claim 3, wherein said beveled edge is formed from an arc.

38. A solar battery as in claim 4, wherein said beveled edge is formed from an arc.

39. A solar battery as in claim 5, wherein said beveled edge is formed from an arc.

40. A solar battery as in claim 6, wherein said beveled edge is formed from an arc.

41. A solar battery as in claim 7, wherein said beveled edge is formed from an arc.

42. A solar battery as in claim 8, wherein said beveled edge is formed from an arc.

43. A solar battery as in claim 9, wherein said beveled edge is formed from an arc.

44. A solar battery as in claim 10, wherein said beveled edge is formed from an arc.

45. A solar battery as in claim 2, wherein said first and second solar battery cells are cut out from a disc-shaped crystal substrate.

46. A solar battery as in claim 3, wherein said first and second solar battery cells are cut out from a disc-shaped crystal substrate.

47. A solar battery as in claim 4, wherein said at least two solar battery cells are cut out from a disc-shaped crystal substrate.

48. A solar battery as in claim 5, wherein said at least two solar battery cells are cut out from a disc-shaped crystal substrate.

49. A solar battery as in claim 6, wherein said first and second solar battery cells are cut out from a disc-shaped crystal substrate.

50. A solar battery as in claim 7, wherein said first and second solar battery cells are cut out from a disc-shaped crystal substrate.

51. A solar battery as in claim 8, wherein said first and second solar battery cells are cut out from a disc-shaped crystal substrate.

52. A solar battery as in claim 9, wherein said first and second solar battery cells are cut out from a disc-shaped crystal substrate.

53. A solar battery as in claim 10, wherein said first and second solar battery cells are cut out from a disc-shaped crystal substrate.

54. A solar battery as in claim 11, wherein said first and second solar battery cells are cut out from a disc-shaped crystal substrate.

* * * * *